United States Patent
Lam et al.

[19]

[11] Patent Number: 5,856,760
[45] Date of Patent: Jan. 5, 1999

[54] OVERDRIVE PROTECTION CLAMP SCHEME FOR FEEDBACK AMPLIFIERS

[75] Inventors: Khanh Lam, El Monte; Lloyd F. Linder, Agoura Hills; Carrie C. Lo, Costa Mesa; Tim M. Ng, Monterey Park; Kelvin T. Tran, Carson, all of Calif.

[73] Assignee: Raytheon Company, El Segundo, Calif.

[21] Appl. No.: 745,070

[22] Filed: Nov. 7, 1996

[51] Int. Cl.$^6$ ........................................ H03F 1/52
[52] U.S. Cl. .............................. 330/298; 327/312
[58] Field of Search ...................... 330/207 P, 242, 330/298; 327/309, 312, 323

[56] References Cited

U.S. PATENT DOCUMENTS

| | | | |
|---|---|---|---|
| 4,718,119 | 1/1988 | Salzer et al. | 330/279 X |
| 5,192,885 | 3/1993 | Gay | 327/309 |
| 5,410,274 | 4/1995 | Birdsall | 330/265 |
| 5,617,046 | 4/1997 | Palara et al. | 327/312 X |

OTHER PUBLICATIONS

G. Neudeck, *The Bipolar Junction Transistor*, vol. III, Addison–Wesley Publishing Co., (1989), pp. 80–81.

*Primary Examiner*—Steven Mottola
*Attorney, Agent, or Firm*—Leonard A. Alkov; William C. Schubert; Glenn H. Lenzen, Jr.

[57] ABSTRACT

A low-noise, low-distortion clamping scheme includes a bootstrapped voltage clamp and an $R_{gm}$ current clamp that provide superior overdrive protection when used together in a Class-AB feedback amplifier. The bootstrapped voltage clamp includes a transistor that is connected to a circuit node to be clamped. The transistor's base is bootstrapped to the node to maintain a constant $V_{be}$ when not clamping, to reduce the adverse effects of the junction capacitance $C_{je}$ which would normally vary with the node voltage and distort the signal at the node. Two such clamps provide positive and negative voltage limiting. The $R_{gm}$ current clamp is used in the input stage of a Class-AB feedback amplifier to limit the current through the resistor $R_{gm}$ that interconnects the current inputs of two transconductance amplifiers whenever the voltage drop across $R_{gm}$ increases to an unacceptable level. The clamp uses a dependent current source whose output current increases with the magnitude of the current flowing through $R_{gm}$ and prevents that current from exceeding a predetermined limit. When not clamping, the clamp has a very small effect on the amplifier's input stage. Two $R_{gm}$ current clamps are typically used to limit current flowing in either direction through $R_{gm}$.

29 Claims, 6 Drawing Sheets

OVERDRIVE PROTECTION CLAMP SCHEME FOR FEEDBACK AMPLIFIERS

GOVERNMENT RIGHTS

This invention was made with Government support. Therefore, the gorvernment has certain rights in this invention.

BACKGROUND OF THE INVENTION

1. Field of the Invention

This invention relates to the field of voltage and current clamps, and particularly to clamping schemes to prevent feedback amplifiers from being overdriven.

2. Description of the Related Art

There are many electronic circuit applications in which it is necessary to prevent the voltage at a circuit node or the current through a circuit component from exceeding a particular value, i.e., to "clamp" the voltage or current at a certain level. Many clamp circuits exist to perform this function.

The need for a clamp circuit often arises when designing an amplifier, to prevent the amplifier from being "overdriven". When overdriven by an excessive input voltage, an amplifier's output no longer varies linearly with changes at its input, which typically happens when the amplifier's output stage becomes saturated. A voltage clamp can be connected to limit the voltage presented at either the input to an amplifier or to the amplifier's output stage, to prevent the amplifier from being overdriven.

Figure 1:
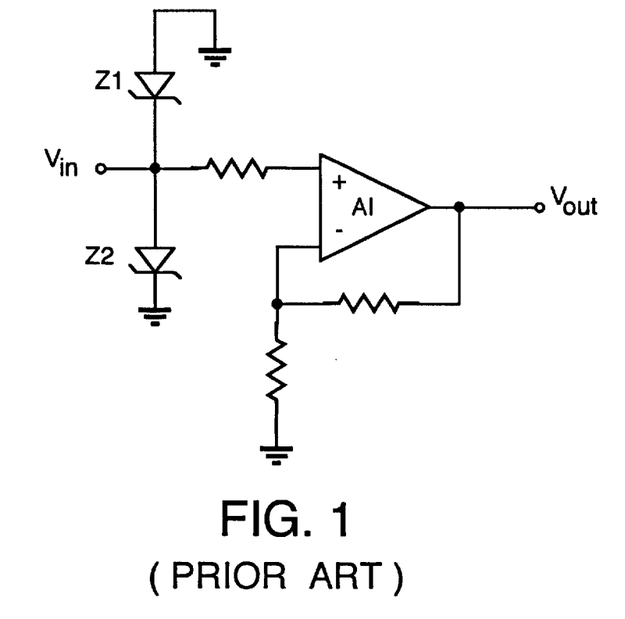
FIG. 1 is a schematic diagram of a prior art input clamping scheme.

When an amplifier is operating in its linear region, a clamp circuit connected to a circuit node ideally will not introduce noise or distortion into the signal at that node. Previous clamp designs have fallen short of this ideal. A simple clamp design is shown in FIG. 1, comprising zener diodes Z1 and Z2 connected to the input of an amplifier A1, to respectively limit the maximum positive and negative voltages that can be presented to A1. Unfortunately, this clamp scheme often affects the performance of the amplifier due to parasitic effects. Since the clamp is connected to the input of the amplifier, it may also have an adverse effect on the circuit driving the input. In addition, the clamp must dissipate large amounts of current when one of the zener diodes is conducting.

Figure 2:
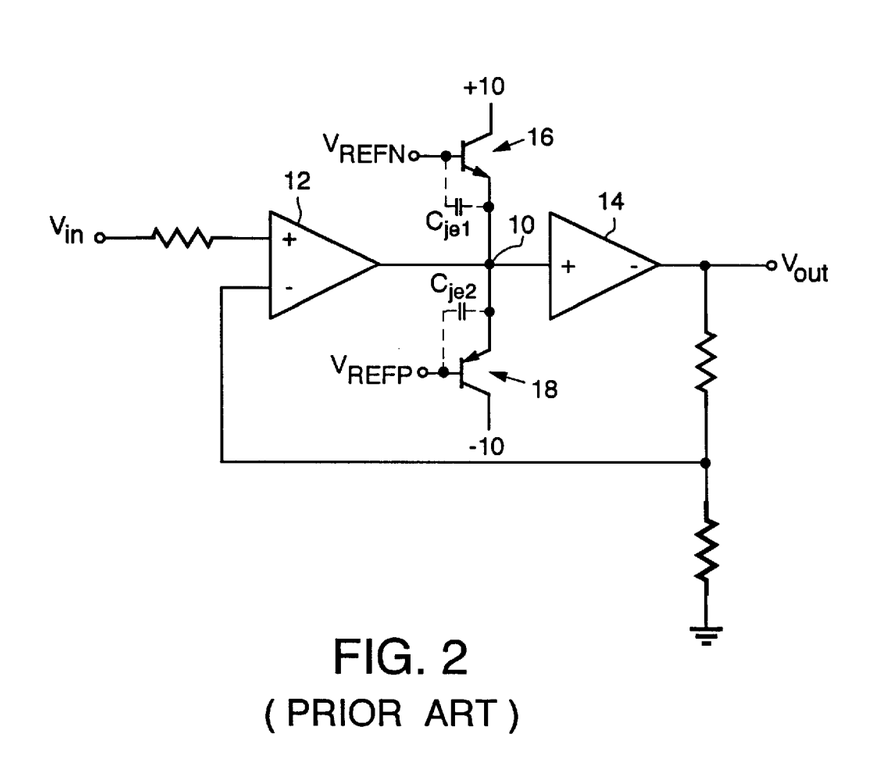
FIG. 2 is a schematic diagram of a prior art clamping scheme which protects an amplifier's output stage from being overdriven.

Another clamp scheme is depicted in FIG. 2, shown connected to a circuit node 10 at the interconnection of the input stage 12 and output stage 14 of a Class A feedback amplifier. At this location the clamp does not directly affect the circuitry driving or being driven by the amplifier. The emitters of an npn transistor 16 and a pnp transistor 18 are both connected to the circuit node. The bases of the npn and pnp devices are connected respectively to negative and positive reference voltages $V_{REFN}$ and $V_{REFP}$. The base-emitter junction of the npn transistor 16 becomes forward-biased when the node drops to a voltage equal to $V_{REFN} - V_{be}$, where $V_{be}$ is the base-emitter threshold voltage for conduction, typically about 0.7 volts. This turns on the transistor 16 and thereby prevents the node voltage from going any more negative, thus clamping the voltage at $V_{REFN} - V_{be}$. The pnp transistor 18 operates similarly, clamping the node at a maximum positive voltage of $V_{REFP} + |V_{be}|$.

There is an inherent problem with the clamp circuit of FIG. 2, however. Each transistor 16, 18 has a respective parasitic capacitance $C_{je1}$, $C_{je2}$ across its base-emitter junction. This capacitance varies non-linearly with the base-emitter voltage, as follows:

$$C_{je1} = \frac{C_{j0}}{\left(1 - \frac{V_{BE}}{V_{BI}}\right)^m} \quad C_{je2} = \frac{C_{j0}}{\left(1 - \frac{V_{EB}}{V_{BI}}\right)^m}$$

where $C_{j0}$ is the zero-biased base-emitter depletion capacitance, $V_{BI}$ is the built-in potential of the base-emitter junction and m=½ for uniform doping and ⅓ for linear doping. A varying voltage at the circuit node 10 modulates each transistor's base-emitter voltage, which results in a $C_{je1}$ and $C_{je2}$ that vary non-linearly with the voltage at the circuit node 10. This non-linear capacitive effect is a source of distortion that degrades the amplifier's performance. The adverse effects of $C_{je}$ are made worse when the clamp is connected to a high impedance node as is typically found between the input and output stages of an amplifier, due to the longer RC time constant that results from the high impedance in combination with $C_{je}$. $C_{je}$ and its effects are discussed, for example, in G. Neudeck, *The Bipolar Junction Transistor*, Volume III, Addison-Wesley Publishing Co., (1989), pp. 80–81.

Figure 3:
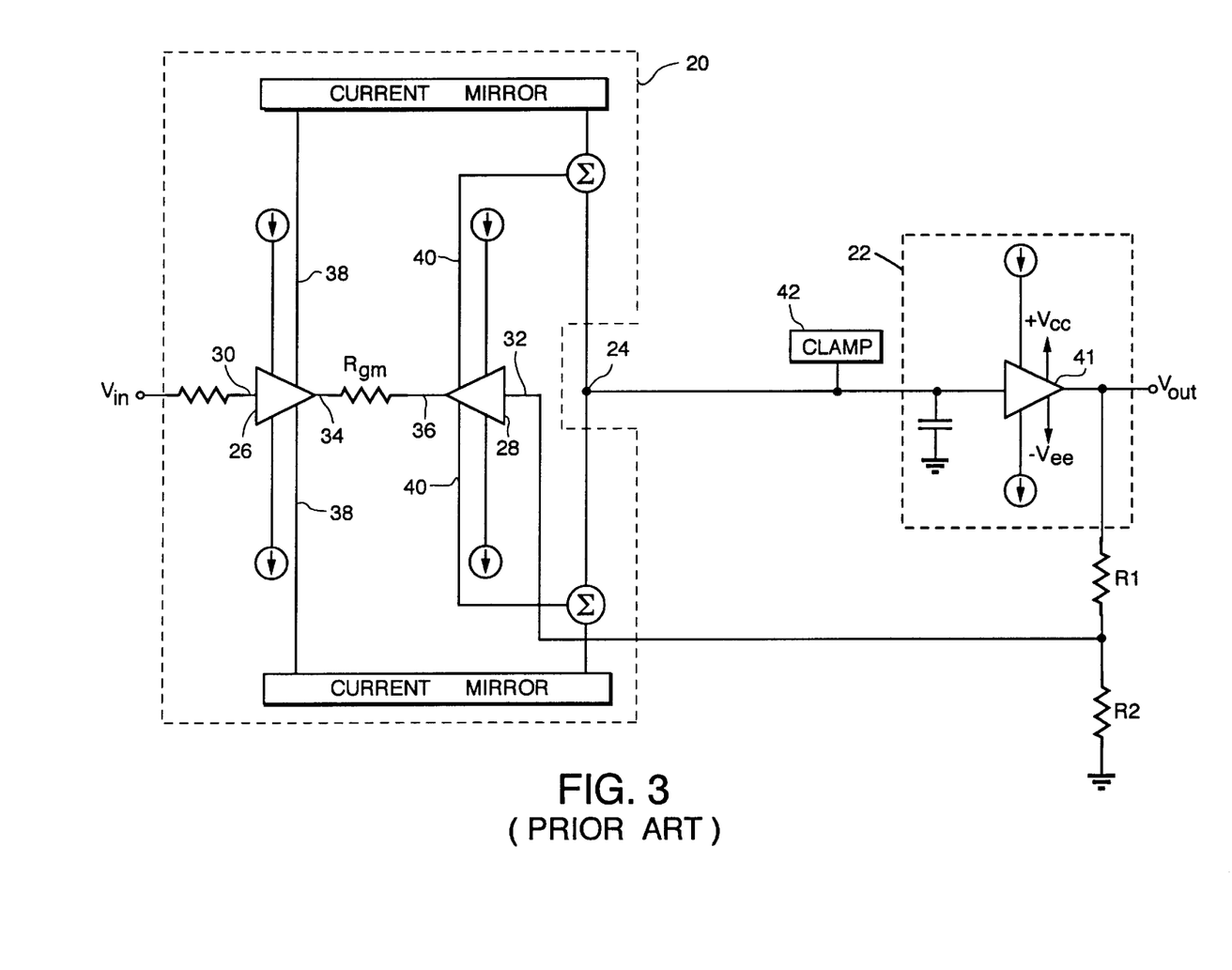
FIG. 3 is a schematic diagram of a prior art Class-AB feedback amplifier which includes a clamp such as that shown in FIG. 2.

Other problems can arise when using a clamp circuit to prevent the signal presented to the output stage of a feedback amplifier from exceeding certain limits. FIG. 3 shows a known Class-AB feedback amplifier having an input stage 20 that is connected to an output stage 22 at a high impedance circuit node 24. The input stage includes transconductance amplifiers 26 and 28, respective high impedance voltage inputs 30 and 32, low impedance current inputs 34 and 36, and push-pull current outputs 38 and 40. A resistor $R_{gm}$ interconnects the two current inputs 34 and 36. The input voltage $V_{in}$ is connected to the voltage input 30 of one transconductance amplifier 26. The output stage 22 includes an output amplifier 41 that produces an output voltage $V_{out}$ which is fed back via a voltage divider comprised of resistors R1 and R2 to the voltage input 32 of transconductance amplifier 28. An amplifier of this type is disclosed in U.S. Pat. No. 5,410,274 to Birdsall et al. A clamp circuit 42 is connected to the node 24 to prevent positive and negative excursions of the signal feeding the output stage 22 from exceeding positive and negative clamp voltage limits, designated $V_{CLAMP+}$ and $V_{CLAMP-}$, respectively, to prevent the output stage from being overdriven.

When operating in its linear region, the amplifier's output voltage $V_{out}$ is equal to $V_{in} \times (1+(R1/R2))$. Due to the action of the feedback loop, the voltage at voltage input 32 is about equal to $V_{in}$, making the voltage across $R_{gm}$ small. A problem arises when the signal at node 24 reaches either $V_{CLAMP+}$ or $V_{CLAMP-}$, so that the clamp circuit 42 prevents the voltage fed to the output stage 22 from increasing or decreasing further. This breaks the amplifier's feedback loop and causes the voltage at voltage input 32 to be held at the clamp voltage multiplied by R2/(R1+R2). Any further increase in $V_{in}$ causes the voltage drop across $R_{gm}$ to increase, thereby generating a current through $R_{gm}$ which can become significantly large since $R_{gm}$ is typically small in a Class-AB amplifier. $R_{gm}$ can become damaged if the current through it becomes too large, as can components connected to $R_{gm}$. Therefore, a need exists for a clamping circuit that will limit the current through a resistor interconnecting two transconductance amplifiers in a Class-AB feedback amplifier.

SUMMARY OF THE INVENTION

A low-noise, low-distortion clamping scheme is presented that solves the problems noted above. The invention comprises a bootstrapped voltage clamp which is applicable whenever a circuit node must be prevented from exceeding a given voltage limit. An $R_{gm}$ current clamp is also presented for protecting the input stage of a Class-AB feedback amplifier. When used together, the two clamp circuits provide superior overdrive protection in a Class-AB feedback amplifier.

The bootstrapped voltage clamp is particularly useful for protecting the output stage of an amplifier from being overdriven. A transistor current circuit is connected to a circuit node to be clamped. The transistor is kept OFF as long as the clamp voltage is not exceeded. The invention bootstraps the transistor's control input to the circuit node so that while the transistor is OFF, the voltage between the control input and the circuit node remains nearly constant. With the voltage constant, $C_{je}$ no longer varies with respect to the signal at the circuit node. Distortion that would otherwise be introduced is thus largely avoided. A comparison circuit causes the transistor to be turned ON when the node voltage exceeds a reference voltage, which prevents the node voltage from increasing. When connected to a node that interconnects an input stage to an output stage of an amplifier, the voltage clamp circuit prevents the output from being overdriven. Two such clamps would typically be used—one to prevent excessive positive voltage excursions and one to prevent excessive negative voltages. The advantages of the bootstrapped voltage clamp are best realized when connected to a high impedance node, where the adverse effects of a varying value of $C_{je}$ are most pronounced.

The $R_{gm}$ current clamp is used in the input stage of a Class-AB feedback amplifier to limit the current through the resistor $R_{gm}$ that interconnects the current inputs of two transconductance amplifiers that make up the input stage. It provides protection whenever a Class-AB amplifier's feedback loop is broken, which can otherwise result in a large voltage drop developing across the interconnecting resistor. One typical application is in a clamp circuit used to limit the signal to a Class-AB amplifier's output stage. The feedback loop is broken when the output stage clamp becomes active and prevents the output voltage from continuing to follow the output of the input stage, and current through the resistor can increase to a damaging level. The $R_{gm}$ current clamp uses a dependent current source whose output current increases with the magnitude of the current flowing through the interconnecting resistor. At a threshold current level the dependent current source diverts enough current to cause an input transistor to be cut-off, which prevents any further increase in the level of current flowing through the resistor. Prior to reaching the clamping limit the clamp circuit draws very little current, and thus has a very small effect on the characteristics of the amplifier's input stage. Two such $R_{gm}$ current clamps would typically be used, to limit current flow in opposite directions through the resistor.

Using two bootstrapped voltage clamps and two $R_{gm}$ current clamps with a Class-AB feedback amplifier is especially effective, with the bootstrapped voltage clamps unobtrusively protecting the amplifier from being overdriven, and the $R_{gm}$ current clamps protecting the interconnecting resistor $R_{gm}$ when one of the bootstrapped voltage clamps break the feedback loop. Complete overdrive protection is provided with little adverse effect on the amplifier's performance.

Further features and advantages of the invention will be apparent to those skilled in the art from the following detailed description, taken together with the accompanying drawings.

DETAILED DESCRIPTION OF THE INVENTION

The invention provides two novel clamping circuits. A bootstrapped voltage clamp prevents the voltage of a circuit node from exceeding a predetermined limit while having negligible adverse effects with respect to noise and distortion on the circuitry being protected when the circuit node is within the limit. Two such voltage clamps are used to provide positive and negative voltage limits. An $R_{gm}$ current clamp limits the current through a resistor $R_{gm}$ that interconnects the current inputs of two transconductance amplifiers that make up the input stage of a Class-AB feedback amplifier, and has a very small effect with respect to noise and distortion on amplifier performance when the clamping limits have not been exceeded. Two such current clamps are used to provide protection against excessive current flowing in either direction through $R_{gm}$. Resistor $R_{gm}$ is preferably a single component but can also consist of a network of resistive elements. When the voltage and current clamps are used together, a low-noise, low-distortion overdrive-protection clamping scheme is provided for Class-AB feedback amplifiers.

Figure 4:
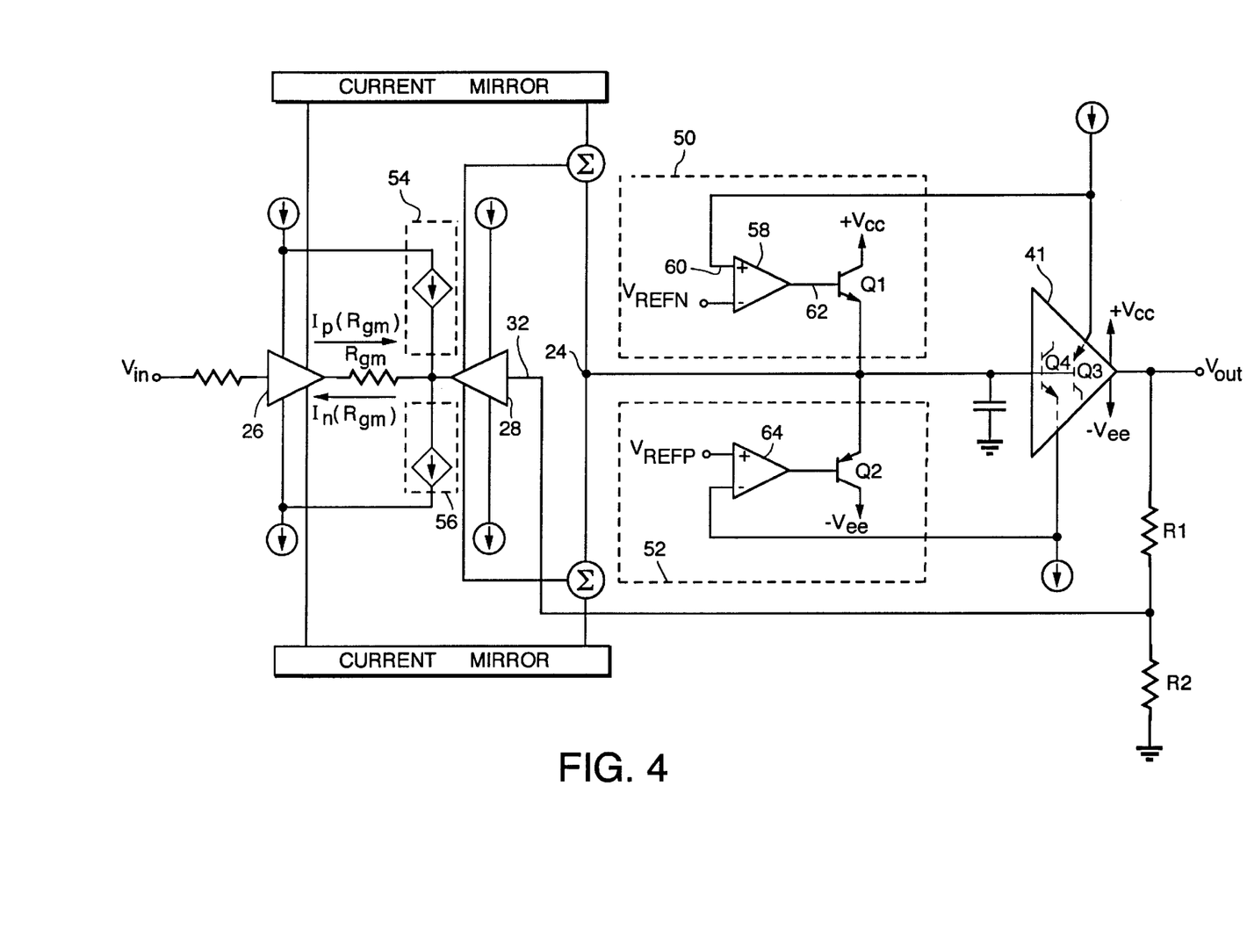
FIG. 4 is a schematic diagram of a Class-AB feedback amplifier incorporating both a bootstrapped voltage clamp and an $R_{gm}$ current lamp per the present invention.

The Class-AB feedback amplifier of FIG. 3 is shown in FIG. 4, incorporating two bootstrapped voltage clamps 50 and 52, and two $R_{gm}$ current clamps 54 and 56. Since such an amplifier typically amplifies a bipolar input voltage, damaging voltage excursions of either polarity can occur. Therefore, two bootstrapped voltage clamps are preferred to establish positive and negative clamping voltages for a particular circuit node. Similarly, two $R_{gm}$ current clamps are preferred to limit current flowing through $R_{gm}$ in either direction. However, a single bootstrapped voltage clamp or current clamp is effective and practical if an application only requires protection in one direction.

The two bootstrapped voltage clamps 50, 52 are connected to circuit node 24, which is the junction between the amplifier's input and output stages. Voltage clamp 50 includes a comparison circuit 58 that receives two inputs: a negative reference voltage $V_{REFN}$, and a signal 60 that is connected to circuit node 24 via the emitter-base circuit of a pnp transistor Q3 that is part of output amplifier 41. Due to the emitter-base voltage drop of Q3, signal 60 is about one diode drop (about 0.7 volts) more positive than the voltage at circuit node 24. Comparison circuit 58 produces an output 62 that is connected to the control input of a transistor Q1, whose current (collector-emitter) circuit is connected to the circuit node 24. Q1 is preferably an npn transistor, with its base connected to output 62 and its emitter connected to circuit node 24.

When signal 60 is more positive than $V_{REFN}$, the output 62 of the comparison circuit 58 causes transistor Q1 to be turned OFF, and circuit node 24 is free to vary. While Q1 is OFF, the voltage at circuit node 24 is bootstrapped to the base of Q1 via the comparison circuit 58 and output stage transistor Q3 so that the base of Q1 moves with the voltage of the node 24. Thus, the voltage between the base of Q1 and the voltage of the node 24, i.e., $V_{be}$ of Q1, is held nearly constant at about 0 volts when Q1 is OFF. Circuit node 24 is a high impedance node; therefore, a varying value of $C_{je}$ produces a varying RC time constant that degrades the amplifier's performance. Thus, by innovatively bootstrapping the circuit node to the base of Q1, the adverse effects of $C_{je}$ are virtually eliminated.

If signal 60 becomes more negative than $V_{REFN}$, Q1 is switched ON, clamping Q1's emitter voltage one diode drop below its base voltage, which prevents circuit node 24 from going any more negative. $V_{REFN}$ is selected to establish a negative clamping voltage for the clamp 50. When implemented with bipolar transistors, the negative clamping voltage $V_{CLAMP-}$ is equal to $V_{REFN}-(2\times|V_{be}|)$. Voltage clamp 52 operates similarly, but all polarities are reversed: $V_{REFP}$ is a positive voltage and Q2 is preferably a pnp transistor connected to comparison circuit 64 via a npn transistor Q4 that is part of output amplifier 41. A positive clamping voltage $V_{CLAMP+}$ is established, which is equal to $V_{REFP}+(2\times|V_{be}|)$.

Output stage transistors Q3 and Q4 perform a level-shifting function for clamps 50 and 52. The node voltage passes through comparison circuits 58 and 64 before reaching the bases of Q1 and Q2. Each comparison circuit imparts a level-shift (discussed below) on the incoming voltage which must be compensated for if the $V_{be}$'s of Q1 and Q2 are to be held at zero volts. In this application Q3 and Q4, as part of output amplifier 41, conveniently provide the necessary compensating level-shifting. In other applications (as in FIG. 6, discussed below), extra components may be needed to provide the necessary level-shifting.

When a clamping voltage is exceeded, clamping circuits such as clamps 50 and 52 act to limit the voltage fed to the output stage of the feedback amplifier. This in turn clamps the output voltage $V_{out}$, breaking the amplifier's feedback loop and causing a constant voltage to be presented at the voltage input 32 of transconductance amplifier 28. Under normal conditions (i.e., when no clamping voltages are being exceeded), voltage input 32 is about equal to $V_{in}$, and the voltage across $R_{gm}$ is small. With the output clamped, an increase in $V_{in}$ causes an increased voltage drop across $R_{gm}$, which can result in a damaging level of current flow through $R_{gm}$. Current clamps 54 and 56 act to limit the amount of current flowing through $R_{gm}$ in either direction, thus protecting $R_{gm}$ and its associated components.

Figure 5:
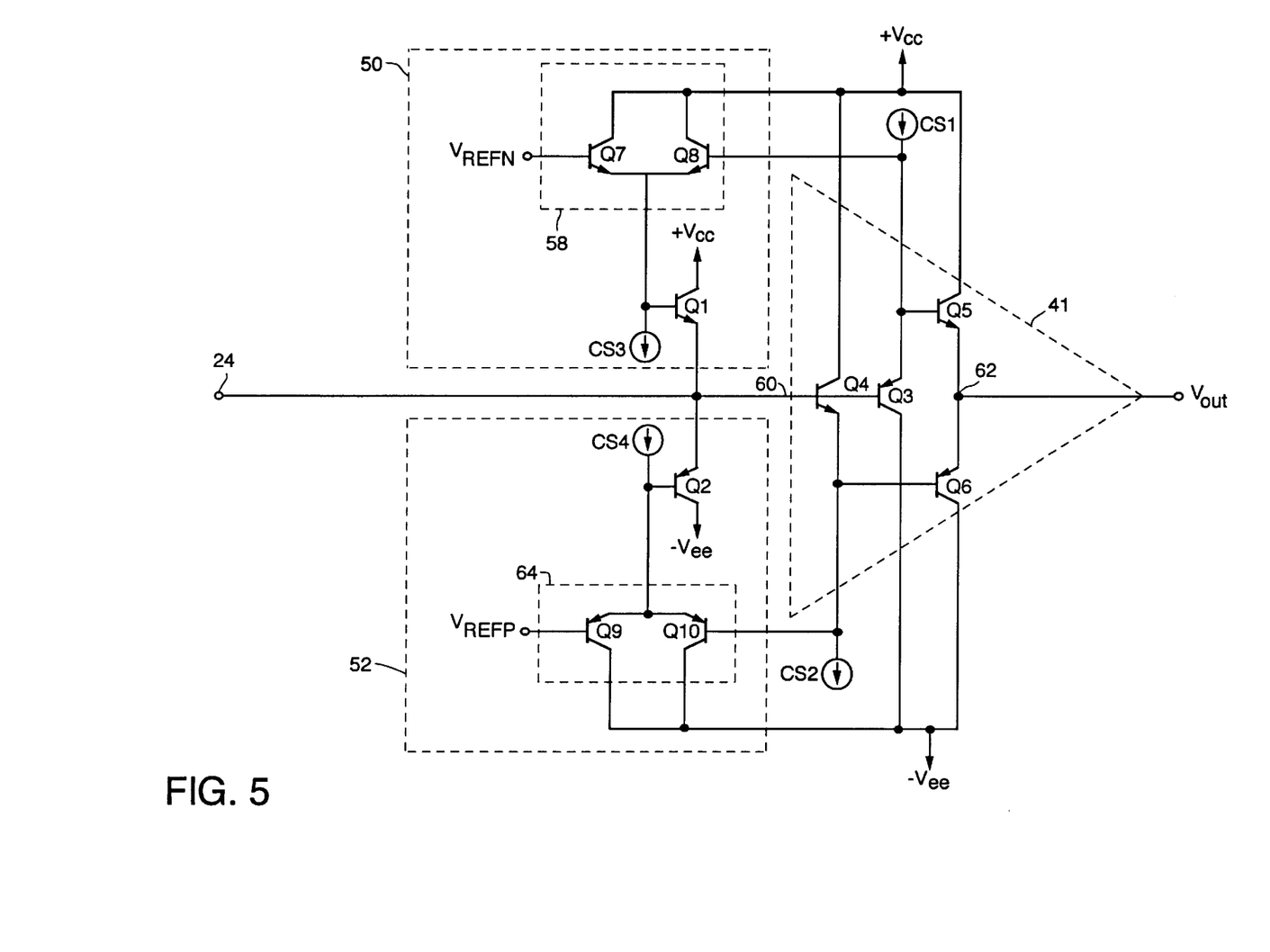
FIG. 5 is a schematic diagram providing details of a bootstrapped voltage clamp per the present invention.

Current clamp 54 is a dependent current source that produces a current output which depends on the amount of current flowing through $R_{gm}$ in a positive direction, identified in FIG. 4 as $I_p(R_{gm})$. Through a mechanism discussed in detail below, clamp 54 prevents $I_p(R_{gm})$ from exceeding a predetermined limit. Current clamp 56 similarly limits current flowing through $R_{gm}$ in the opposite direction, identified as $I_n(R_{gm})$ A detailed implementation of a bootstrapped voltage clamp, used in conjunction with the output amplifier 41 of a Class-AB feedback amplifier is shown in FIG. 5. Output amplifier 41 comprises four transistors Q3–Q6, preferably bipolar junction transistors (BJTs), arranged in a Class-AB configuration. A signal presented at an input 60 is fed to the respective bases of pnp transistor Q3 and npn transistor Q4. The emitters of Q3 and Q4 are connected to the bases of npn transistor Q5 and pnp transistor Q6, respectively, which are arranged in a push-pull configuration. The emitters of Q5 and Q6 are connected at a common node 62, which is the stage's output. A current source CS1 is connected to supply current to the base of Q5 and the emitter of Q3, and another current source CS2 is connected to draw current from the base of Q6 and the emitter of Q4. This same arrangement of transistors and current sources is also present in the transconductance amplifiers 26 and 28 that are included in the input stage of the Class-AB feedback amplifier depicted in FIGS. 3 and 4.

Circuit node 24 is connected to the input 60 of the output amplifier 41. Two bootstrapped voltage clamps 50 and 52 are implemented to prevent the signal at circuit node 24 from exceeding either a positive voltage designated as $V_{CLAMP+}$ or a negative voltage designated as $V_{CLAMP-}$. These clamping voltages are selected to prevent output amplifier 41 from being overdriven.

Bootstrapped voltage clamp 50 provides the negative voltage clamp, and comprises three transistors Q1, Q7 and Q8, preferably npn BJTs, and a current source CS3. Transistor Q3 and current source CS1 are also needed to provide the bootstrapping function, as described below. Transistors Q7 and Q8 are arranged as a differential pair, with the base of Q7 connected to a negative reference voltage $V_{REFN}$ and the base of Q8 connected to the emitter of output stage transistor Q3, whose base is connected to circuit node 24. The collectors of Q7 and Q8 are both connected to $+V_{CC}$, which is typically between +5 and +15 volts. The emitters of Q7 and Q8 are tied together at a common node which is connected to the base of Q1 and to the current source CS3, which biases the differential pair Q7 and Q8 that forms comparison circuit 58. The emitter of Q1, the "clamping transistor", is connected to the circuit node 24.

The bootstrapped voltage clamp 50 operates as follows. Assume that $V_{REFN}$ is equal to -3 volts and circuit node 24 is currently at -1 volt and heading more negative. The base of transistor Q3 is also at -1 volt. Current source CS1 biases the emitter-base junction of Q3, so that the emitter of Q3 will be one diode drop more positive than its base, or at about -0.3 volts; CS1 and Q3 thus effectively perform a level-shifting function on the node voltage. Thus, the voltages at the bases of differential pair transistors Q7 and Q8 are -3 volts and -0.3 volts, respectively. Since the base of Q8 is at a higher potential than Q7, Q8 is ON and Q7 is OFF. With Q8 ON, the voltage at its emitter will be one diode drop more negative than the voltage at its base, which will be $-0.3-0.7=-1$ volt. Thus, the voltage at circuit node 24 has been bootstrapped to the base of Q1, which will continue to follow the node voltage as long as transistor Q8 is ON, resulting in a $V_{be}$ for Q1 that remains at about 0 volts. With a fairly constant value for $V_{be}$, the $C_{je}$ of transistor Q1 remains fairly constant, so that the clamp 50 causes little to no degradation of the signal at node 24.

As the node voltage goes increasingly negative, so does the voltage at the base of differential pair transistor Q8. When Q8's base voltage exceeds -3 volts, Q8 will turn OFF and Q7 will turn ON. This forces the emitter of Q7 to be one diode drop more negative than its base, or at $-3-0.7=-3.7$ volts. Now, Q1 will turn ON when its emitter voltage becomes one diode drop more negative than its base voltage, or at −3.7−0.7=−4.4 volts. Therefore, if circuit node 24 reaches a negative voltage of −4.4 volts, Q1 is turned ON with its emitter clamped at −4.4 volts, and the node 24 cannot go any more negative than −4.4 volts. Note that once Q7 turns ON, the base of Q1 is held at −3.7 volts and no longer tracks the circuit node voltage. Though the circuit node is not clamped until it reaches −4.4 volts, no bootstrapping is in effect while the circuit node voltage is between −3.7 volts and −4.4 volts, and the adverse effects of a varying $C_{je}$ will be present in this range. Thus, the effective range of the clamp, i.e., that range over which bootstrapping is effective and $C_{je}$ effects are reduced, is one diode drop less than the clamping voltage limit. For example, if $V_{CLAMP+}$ and $V_{CLAMP-}$ are about ±5 volts, the clamp's effective range is about ±4.3 volts.

Reference voltage $V_{REFN}$ is related to the clamping voltage $V_{CLAMP-}$ as follows:

$$V_{CLAMP-} = V_{REFN} - (2 \times |V_{be}|), \text{ or}$$

$$V_{REFN} = V_{CLAMP-} + (2 \times |V_{be}|).$$

Thus, to establish a negative clamping voltage of −5 volts at circuit node 24, $V_{REFN}$ should be made equal to −5+(2×0.7) =−3.6 volts (assuming a typical $V_{be}$ of 0.7 volts).

Bootstrapped voltage clamp 52 is used to provide a positive clamping voltage, and operates the same as clamp 50 except that all polarities are reversed. The clamp comprises three pnp transistors Q2, Q9 and Q10, and a current source CS4. Transistors Q9 and Q10 form a differential pair, with the base of Q9 connected to a positive reference voltage $V_{REFP}$ and the base of Q10 connected to the emitter of output stage transistor Q4. The collectors of Q9 and Q10 are connected to negative supply voltage $-V_{ee}$, typically −5 to −15 volts. Via the mechanism discussed above for clamp 50, transistor Q2 prevents circuit node 24 from exceeding a voltage $V_{CLAMP+}$ that is related to $V_{REFP}$ as follows:

$$V_{CLAMP+} = V_{REFP} + (2 \times |V_{be}|) \text{ or}$$

$$V_{REFP} = V_{CLAMP+} - (2 \times |V_{be}|).$$

Via bootstrapping as discussed herein, the $V_{be}$'s of Q1 and Q2 are kept constant at about 0 volts. However, it is not essential that the $V_{be}$'s be held at zero volts, since bootstrapping Q1's $V_{be}$ so that it is held at a constant negative voltage (or Q2's $V_{eb}$ so that is held at a constant negative voltage) still provides the performance improvements gained by reducing the effect of a varying junction capacitance. A bootstrapping that results in a positive $V_{be}$ for Q1 or a positive $V_{eb}$ for Q2 while the circuit node voltage is within the clamping limits should be avoided, since this condition is likely to cause leakage current to flow through Q1 or Q2 and thus degrade the signal at the node.

Bootstrapping Q1's $V_{be}$ to a negative voltage can be achieved, for example, by adding a diode between the junction of the emitters of Q7 and Q8 and the base of Q1, adding a diode drop and thus bootstrapping $V_{be}$ to −0.7 volts. A negative $V_{be}$ lowers the capacitance value of $C_{je}$ below the already low value present when $V_{be}$ is equal to zero. Doing this does have a drawback however, in that the range of node voltages over which bootstrapping is effective is narrower than when bootstrapped to zero volts. Refering back to the example given in connection with the clamp 50 in FIG. 5, with $V_{REFN}$ set to −3 volts, $V_{CLAMP-}$ was equal to −4.4 volts and bootstrapping was ineffective for circuit node voltages between −3.7 and −4.4 volts. If a diode is added between the emitters of Q7 and Q8 and the base of Q1, $V_{CLAMP-}$ can still be −4.4 volts as long as $V_{REFN}$ is set to −2.3 volts, to accomodate the additional diode drop. However, now bootstrapping becomes ineffective when the circuit node voltage is between −3 and −4.4 volts, so that 0.7 volts of clean signal range are lost. An analysis of the effect of bootstrapping $V_{eb}$ of Q2 to a positive voltage produces the same effective-range-reducing result. Thus, bootstrapping Q1's $V_{be}$ and Q2's $V_{eb}$ to zero volts is preferred to provide both very low values of junction capacitance and a circuit node voltage range for which bootstrapping is effective that is a significant percentage of the total clamp voltage range.

Figure 6:
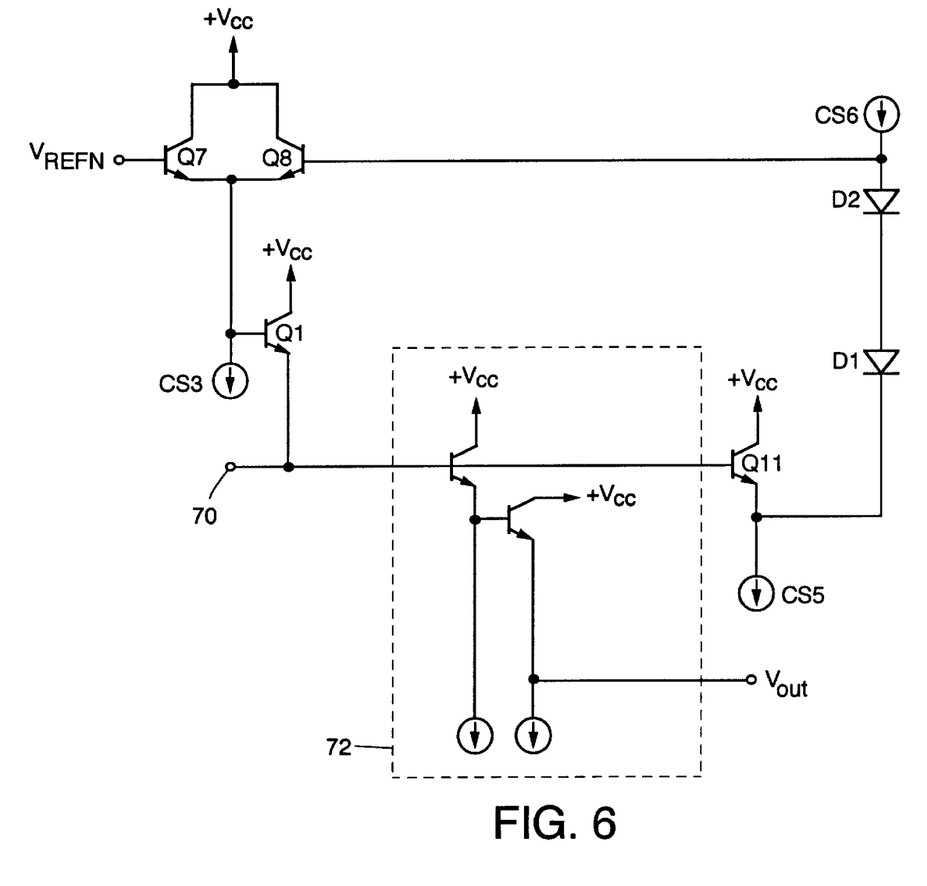
FIG. 6 is a schematic diagram of an application of a bootstrapped voltage clamp to protect the output stage of a Class-A amplifier.

Bootstrapping the clamping transistors Q1 and Q2 to the circuit node 24 to reduce the effects of a varying $C_{je}$ make the clamp very effective in a low-distortion, low-noise amplifier application. In FIG. 6, an all-npn clamp is shown being used to protect the output stage of a Class-A feedback amplifier from being overdriven in the negative direction. The operation of this clamp is similar to the negative bootstrapped voltage clamp 50 for the Class-AB amplifier of FIG. 5, except that some additional components must be provided that were an inherent part of the Class-AB design. As in FIG. 5, the all-npn clamp comprises a comparison circuit formed from biasing current source CS3 and differential pair transistors Q7 and Q8, with the emitters of Q7 and Q8 feeding the base of Q1, whose emitter is now connected to a node 70. Node 70 is at the junction of the input and output stages of a typical Class-A amplifier, with the clamp provided to protect the output stage 72 from being overdriven in the negative direction.

Note that for the Class-AB application of FIG. 5, the level-shifting function needed to provide the bootstrapping was performed by components CS1 and Q3, which were already part of the amplifier's output stage. However, additional components must be added to provide the same level-shifting function for the all-npn clamp in FIG. 6. The node 70 is connected to the control input of a transistor Q11 which has a biasing current source CS5 in its emitter circuit. Q11 serves to buffer the signal at node 70, and the voltage at Q11's emitter is one diode drop below that at node 70. A biasing current source CS6 is connected to the anode of a diode D2 which in turn is connected in series with a diode D1 whose cathode is connected to the emitter of Q11. These diodes serve to level-shift Q11's emitter voltage up by two diode drops. The anode of D2 is also connected to the base of differential pair transistor Q8 which, when ON, introduces a diode drop and presents a voltage to the base of Q1 that is about equal to the voltage at the node 70. Q11, D1, D2, CS5 and CS6 are thus needed to bootstrap the node 70 to the base of Q1 so that, as before, the adverse effects of a varying $C_{je}$ are substantially reduced.

The application of FIG. 6 depicts the use of a single all-npn clamp that protects a node from excessive negative voltage excursions only. A clamp to protect a node from an excessive positive voltage could be similarly implemented with an all-pnp transistor design.

The bootstrapped voltage clamp can be implemented to limit the voltage of any high impedance circuit node, provided level-shifting components are included such as those shown in FIG. 6. There are, however, fewer advantages to bootstrapping if the introduction of distortion and/or noise is not a concern.

The bootstrapped voltage clamp can also be implemented with FET transistors, replacing npn's with n-FETs and pnp's with p-FETs. The parasitic capacitance between the gate and source of a FET clamping transistor can adversely affect circuit performance. Just as for a BJT, bootstrapping can reduce the effect of a varying $C_{gs}$ for a FET. Note, though, that since the collector current for a BJT is a function of $e^{Vbe/V_T}$, while a FET's drain current is a function of $V_{gs}^2$, a FET clamp is inherently not as effective as a BJT clamp.

Figure 7:
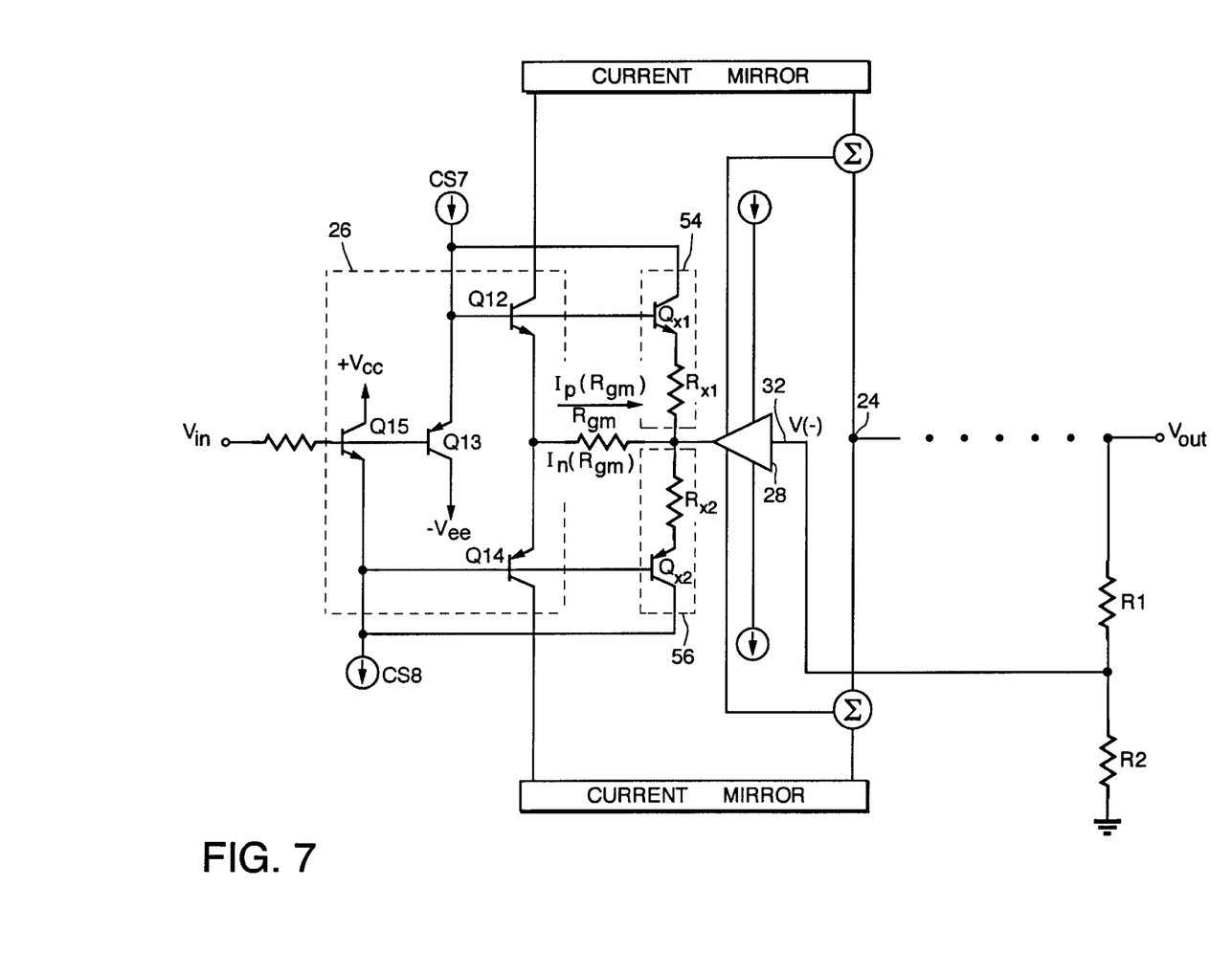
FIG. 7 is a schematic diagram providing details of an $R_{gm}$ current clamp per the present invention.

FIG. 7 is a detailed schematic diagram of the $R_{gm}$ current clamps 54 and 56 of FIG. 4, with the components that make up transconductance amplifier 26 also shown; the output amplifier 41 is not shown. During "normal" operation of the Class-AB feedback amplifier, i.e., when $V_{out}$ varies linearly with $V_{in}$, the voltage fed back via voltage divider resistors R1 and R2 to the input 32 of transconductance amplifier 28, designated V(−), is about equal to $V_{in}$. A current flows through $R_{gm}$ that is approximately equal to $(V_{in}-V(-))/R_{gm}$. If $V_{in}$ is more positive than V(−), a current $I_p(R_{gm})$ flows through $R_{gm}$ in one direction, and if $V_{in}$ is lower than V(−), a current $I_n(R_{gm})$ flows through $R_{gm}$ in the opposite direction. During normal operation, current flowing in either direction through $R_{gm}$ is small, typically about 100 μa.

When a voltage clamp has been connected to the circuit node 24 that feeds the output amplifier 41, a serious problem can arise with respect to the current through $R_{gm}$. If the voltage at the node 24 attempts to exceed the clamping voltage, the clamp acts to prevent this. This effectively causes the output voltage $V_{out}$ to stop changing with the input voltage $V_{in}$. When this happens the feedback loop is broken, and V(−) is clamped to a value equal to the voltage at node 24 (the clamp voltage) multiplied by R2/(R1+R2). Any further increase in $V_{in}$ in the direction in which it was headed when the clamp voltage was reached will increase the voltage drop across $R_{gm}$, thereby generating more current through $R_{gm}$. Without some type of current clamp in place, this current can become high enough to damage $R_{gm}$ or components connected to it.

Current clamp 54 performs this function by limiting $I_p(R_{gm})$ It includes a transistor $Q_{x1}$, preferably a BJT, and a resistor $R_{x1}$. Current clamp 56 limits $I_n(R_{gm})$, and comprises a transistor $Q_{x2}$ and resistor $R_{x2}$. The mechanism by which each clamp 54, 56 operates is identical, so the following detailed discussion of the operation of clamp 54 applies to both.

The base of transistor $Q_{x1}$ is connected to the base of input stage push-pull transistor Q12, and $Q_{x1}$'s collector is connected to a current source CS7 which is also connected to the base of Q12. The emitter of $Q_{x1}$ is connected via resistor $R_{x1}$ to one side of resistor $R_{gm}$. Since the bases of $Q_{x1}$ and Q12 are connected together, the voltages at their respective emitters will be about equal at one diode drop below the voltages at their bases. This results in a current flow $I(R_{x1})$ through emitter resistor $R_{x1}$ that is related to the current flow through $R_{gm}$ as follows:

$$I(R_{x1})=I_p(R_{gm}) \times (R_{gm}/R_{x1}).$$

Thus, as $I_p(R_{gm})$ increases due to the clamping of V(−), so does the current through $R_{x1}$. Input stage transistor Q13, biased by current source CS7, is normally tracking the input voltage $V_{in}$. However, as $I(R_{x1})$ increases with $I_p(R_{gm})$, more and more of Q13's bias current is diverted to the collector of $Q_{x1}$. When all of Q13's bias current is diverted by $Q_{x1}$, Q13 is cut-off and no longer tracks $V_{in}$. With Q13 cut-off, the voltage at the bases of both $Q_{x1}$ and Q12 are fixed one diode drop above the voltage at $Q_{x1}$'s emitter, i.e., fixed at a voltage of about $(I(R_{x1}) \times R_{x1})+0.7$ volts+V(−). With the base of Q12 at a fixed voltage, $I_p(R_{gm})$ cannot increase any further and is thus clamped.

The same mechanism is used to limit $I_n(R_{gm})$ with clamp 56. The relationship between $I_n(R_{gm})$ and the current $I(R_{x2})$ flowing through resistor $R_{x2}$ is as follows:

$$I(R_{x2})=I_n(R_{gm}) \times R_{gm}/R_{x2}.$$

The maximum current through $R_{gm}$ is set by the values of resistors $R_{x1}$, $R_{x2}$, $R_{gm}$, and the current outputs of CS7 and CS8. Assume CS7 produces an output of 10 ma, $R_{gm}$ is 10 Ω, and it is desired to establish a limit for $I_p(R_{gm})$ of 100 ma. While clamped, nearly all of the current from CS7 passes through $R_{x1}$, so $I(R_{x1}) \approx 10$ ma. Thus, $$10 \text{ ma} = 100 \text{ max}(10 \text{ }\Omega/R_{x1}\Omega).$$

An $R_{x1}$ of 100 Ω will thus clamp $I_p(R_{gm})$ at about 100 ma.

When not actively clamping the current through $R_{gm}$, only a small bias current passes through $R_{x1}$ and $R_{x2}$ because the current through $R_{gm}$ is small. Consequently, $Q_{x1}$ and $Q_{x2}$ are biased with a very low current, and thus have a very small effect on the characteristics of the amplifier's input stage.

The current clamps could also be implemented with FETs in place of $Q_{x1}$ and $Q_{x2}$. However, the voltage drop from the base to the emitter of Q12 would then be different from the voltage drop between the gate and source of $Q_{x1}$, so that the equations for $I(R_{x1})$ and $I(R_{x2})$ would need to be modified to account for the difference. If, however, the input stage's push-pull transistors Q12 and Q14 were also FETs, the equations remain as shown, since the two voltage drops would again be about equal.

In fact, although the Class-AB feedback amplifier discussed herein has been described and illustrated as being embodied using bipolar transistors, it may alternatively be embodied by field-effect or other types of transistors which provide the required functions. When applied to a FET, the term "control input" as used herein refers to its gate and "current circuit" to its source-drain circuit.

While particular embodiments of the invention have been shown and described, numerous variations and alternate embodiments will occur to those skilled in the art. Accordingly, it is intended that the invention be limited only in terms of the appended claims.

We claim:

1. An overdrive-protection clamp scheme suitable for use with an amplifier, comprising:

an amplifier, comprising:

an input stage suitable for receiving an input voltage and producing an output at a circuit node, and an output stage connected to said circuit node for receiving said output from said input stage and producing an output voltage that varies with said input voltage; and at least one bootstrapped voltage clamp connected to said circuit node, each comprising:

a transistor having a control input that modulates a current circuit connected to said circuit node, said control input bootstrapped to said circuit node so that the voltage drop between said control input and said circuit node remains about constant as the voltage at said node varies and is less than a first predetermined voltage, said bootstrapping reducing the adverse effects of said transistor's junction capacitance, and a comparison circuit connected to turn on said transistor when said circuit node voltage exceeds a second predetermined voltage to clamp said circuit node at said second predetermined voltage.

2. The clamp scheme of claim 1, wherein said at least one bootstrapped voltage clamp comprises first and second bootstrapped voltage clamps connected to said circuit node, said first bootstrapped voltage clamp clamping the voltage at said node at a predetermined positive voltage and said second bootstrapped voltage clamp clamping the voltage at said node at a predetermined negative voltage.

3. The clamp scheme of claim 1, wherein said input stage includes two transconductance amplifiers interconnected by a resistor, said amplifier further comprising:

at least one current clamp for limiting current through said resistor, each of said at least one current clamps comprising a dependent current source which is dependent on the current flowing through said resistor and limits said current through said resistor to a predetermined value.

4. The clamp scheme of claim 1, wherein said at least one current clamp comprises first and second current clamps, said first current clamp limiting current through said resistor in a first direction and said second current clamp limiting current through said resistor in an opposite direction.

5. An overdrive-protection clamp scheme suitable for use with a feedback amplifier, comprising:
  a feedback amplifier, comprising:
    a first transconductance amplifier having a first voltage input, a first current input and a first pair of current outputs,
    a second transconductance amplifier having a second voltage input, a second current input and a second pair of current outputs, said first and second pairs of current outputs operably summed at a summing node and said first and second current inputs interconnected with a resistor $R_{gm}$, and
    an output stage connected to said summing node and producing an output voltage that is fed back to said second voltage input, said output voltage varying with an input voltage presented at said first voltage input when said amplifier is not overdriven;
  at least one $V_{be}$-bootstrapped voltage clamp, each comprising:
    a bipolar transistor having an emitter connected to said summing node and a base that is bootstrapped to said summing node so that said transistor's base-emitter voltage remains about constant as the voltage at said node varies and said amplifier is not overdriven, and
    a comparison circuit connected to turn on said transistor when said summing node voltage exceeds a predetermined voltage to clamp said summing node at said predetermined voltage; and
  at least one current clamp for limiting current through said resistor $R_{gm}$ interconnecting said current inputs, each of said at least one current clamps comprising a dependent current source connected to one terminal of said resistor $R_{gm}$, said current source dependent on the current flowing through said resistor and limiting said current through said resistor to a predetermined value.

6. The clamp scheme of claim 5, wherein said feedback amplifier is a Class-AB feedback amplifier.

7. The clamp scheme of claim 6, wherein each of said transconductance amplifiers comprises transistors arranged in a Class-AB configuration.

8. The clamp scheme of claim 5, wherein said summing node is a high impedance node.

9. The clamp scheme of claim 5, wherein said at least one $V_{be}$-bootstrapped voltage clamp comprises first and second bootstrapped voltage clamps connected to said circuit node, said first bootstrapped voltage clamp clamping the voltage at said node at a predetermined positive voltage and said second bootstrapped voltage clamp clamping the voltage at said node at a predetermined negative voltage.

10. The clamp scheme of claim 5, wherein said at least one current clamp comprises first and second current clamps, said first current clamp limiting current through said resistor in a first direction and said second current clamp limiting current through said resistor in an opposite direction.

11. The clamp scheme of claim 5, further comprising level-shifting circuitry between said circuit node and said comparison circuit to provide said bootstrapping.

12. The clamp scheme of claim 11, wherein said level-shifting circuitry comprises two diodes connected in series with a source of bias current.

13. The clamp scheme of claim 5, wherein said comparison circuit comprises two transistors configured as a differential pair and a source of bias current.

14. The clamp scheme of claim 5, wherein a junction capacitance exists between the base and emitter of said transistor that varies with the voltage drop between said base and emitter, said bootstrapping reducing the adverse effects of said varying junction capacitance on the performance of said amplifier.

15. The clamp scheme of claim 14, wherein said bootstrapping causes said transistor's base-emitter voltage to remain about constant at about zero volts.

16. A voltage clamp suitable for limiting the voltage at a circuit node, comprising:
  a transistor having a control input that modulates a current circuit connected to a circuit node, said control input bootstrapped to said circuit node so that the voltage drop between said control input and said circuit node remains about constant as the voltage at said node varies and is less than a first predetermined voltage, said bootstrapping reducing the adverse effects of said transistor's junction capacitance, and
  a comparison circuit connected to turn on said transistor when said circuit node voltage exceeds a second predetermined voltage to clamp said circuit node at said second predetermined voltage.

17. The voltage clamp of claim 16, wherein said circuit node is an interconnection point between an input stage and an output stage of an amplifier, said voltage clamp for preventing said amplifier from being overdriven.

18. The voltage clamp of claim 16, wherein a junction capacitance exists between said control input of said transistor and said circuit node that varies with the voltage drop between them, said bootstrapping reducing the adverse effects of said varying junction capacitance by maintaining said voltage drop substantially constant, said voltage clamp introducing substantially no noise or distortion into a signal at said node when the voltage at said node is less than said predetermined voltage.

19. The voltage clamp of claim 17, wherein said amplifier is a Class-AB feedback amplifier.

20. The voltage clamp of claim 17, wherein said amplifier is a Class-A feedback amplifier.

21. The voltage clamp of claim 16, wherein said transistor is a bipolar transistor having a base that is $V_{be}$-bootstrapped to the voltage at said circuit node.

22. The voltage clamp of claim 16, further comprising level-shifting circuitry between said circuit node and said comparison circuit, such that said circuit node is bootstrapped to said control input via said comparison circuit and said level-shifting circuitry.

23. The voltage clamp of claim 22, wherein said bootstrapping causes the voltage between said transistor's control input and said circuit node to remain about constant at about zero volts.

24. A $V_{be}$-bootstrapped voltage clamp suitable for clamping a circuit node to prevent said node from exceeding a predetermined clamp voltage, comprising:
  a comparison circuit having first and second inputs, said first input connected to a reference voltage and said second input connected to a level-shifting circuit connected to a circuit node, and an output that in a first state varies with said circuit node when the voltage at said second input is less than the voltage at said first input and in a second state is a fixed voltage when the voltage at said second input is greater than the voltage at said first input, a first transistor having a current circuit and a control input that modulates said current circuit, said control input connected to receive said comparison circuit output and said current circuit connected to said circuit node, such that when said comparison circuit output is in said first state said first transistor is bootstrapped to said circuit node reducing the adverse effects of said first transistor's junction capacitance, and when said comparison circuit output is in said second state and the voltage drop between said control input and said circuit node is sufficiently large said first transistor is turned on and clamps said node at a predetermined clamp voltage, and a level-shifting circuit connected between said circuit node and said comparison circuit, said level-shifting circuit receiving the voltage at said node as an input, level-shifting said voltage and presenting said level-shifted voltage to the second input of said comparison circuit, such that the voltage at said first transistor's control input is about equal to the voltage at said node when said comparison circuit output is in said first state.

25. The voltage clamp of claim 24, wherein said first transistor is a bipolar transistor having a base that is bootstrapped to the voltage at said circuit node and an emitter connected to said node such that said first transistor's base-emitter voltage is about zero volts when the voltage at said second input of said comparison circuit has not exceeded said reference voltage.

26. The voltage clamp of claim 24, wherein said comparison circuit comprises second and third npn transistors, in which the base of said second transistor is connected to a negative reference voltage $V_{REFN}$, the base of said third transistor is connected to the output of said level-shifting circuit, and the emitters of said second and third transistors are both connected to the base of said first transistor and to a current source, said clamp preventing said node from exceeding a negative voltage equal to $V_{REFN}-(V_{be}$ of the second transistor$+V_{be}$ of the first transistor).

27. The voltage clamp of claim 24, wherein said comparison circuit comprises second and third pnp transistors, in which the base of said second transistor is connected to a positive reference voltage $V_{REFP}$, the base of said third transistor is connected to the output of said level-shifting circuit, and the emitters of said second and third transistors are both connected to the base of said first transistor and to a current source, said clamp preventing said node from exceeding a positive voltage equal to $V_{REFP}+(V_{be}$ of the second transistor$+V_{be}$ of the first transistor).

28. The voltage clamp of claim 24, wherein said clamp is connected to a circuit node that feeds an output stage of a Class-AB feedback amplifier.

29. The voltage clamp of claim 24, wherein said clamp is connected to a circuit node that feeds an output stage of a Class-A feedback amplifier.

\* \* \* \* \*